(12) United States Patent
Hajnal

(10) Patent No.: US 6,380,736 B1
(45) Date of Patent: Apr. 30, 2002

(54) MAGNETIC RESONANCE IMAGING APPARATUS

(75) Inventor: Joseph Vilmos Hajnal, London (GB)

(73) Assignee: Marconi Medical Systems, Inc., Cleveland, OH (US)

( * ) Notice: Subject to any disclaimer, the term of this patent is extended or adjusted under 35 U.S.C. 154(b) by 0 days.

(21) Appl. No.: 09/713,956

(22) Filed: Nov. 16, 2000

(30) Foreign Application Priority Data

Nov. 16, 1999 (GB) ............................................ 9927015
Mar. 13, 2000 (GB) ............................................ 0005922

(51) Int. Cl.⁷ ................................................ G01V 3/00
(52) U.S. Cl. ...................................... 324/306; 324/309
(58) Field of Search ............................... 324/306, 307, 324/308, 309, 312, 314, 318, 322

(56) References Cited

U.S. PATENT DOCUMENTS 5,167,232 A * 12/1992 Parker et al. ................ 324/306
5,528,144 A    6/1996 Gullapalli .................... 324/306
6,037,771 A *  3/2000 Liu et al. ..................... 324/309

FOREIGN PATENT DOCUMENTS

EP       0 759561 A2    2/1997

OTHER PUBLICATIONS

Supplement to Radiology, Nov. 2000, vol. 217; Radiological Society of North America Nov. 2000 Book of Abstracts, p. 205; A. H. Herlihy, et al.; Elimination of CSF Flow Artefacts in FLAIR Imaging of the Brain and Spinal Cord Using K–space Reordered by Inversion–time for Each Slice Position.

Magnetic Resonance Materials in Physics, Biology and Medicine; vol. 8 Suppl. Sep. 1, 1999; ESMRMB Sept. 16–19, p. 108, Proc. 264, David G. Norris; Low power Multi–slice MDEFT imaging.

* cited by examiner

*Primary Examiner*—Louis Arana
(74) *Attorney, Agent, or Firm*—John J. Fry; Thomas M. Lundin

(57) ABSTRACT

A non-selective inversion pulse is applied to a plurality of slices, r.f. resonance in MR active nuclei is excited in each of those slices individually, and the slice excitation order is cycled so that the time for the non-selective inversion pulse to any particular phase-encode gradient of all the slices is the same, the time of the zero phase-encode gradient corresponding to that for zero signal from cerebro spinal or other moving fluids.

5 Claims, 2 Drawing Sheets

Pulse sequence details

Grey matter/white matter point spread function (top) and CSF point spread function (bottom) plotted on the same scale

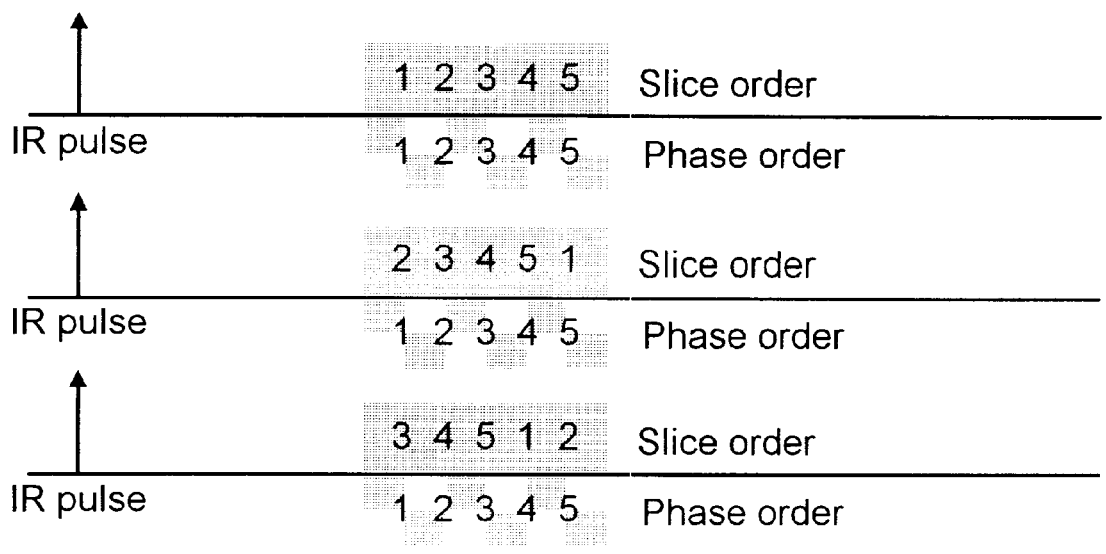
Loop on all slices, then repeat with new phase order...
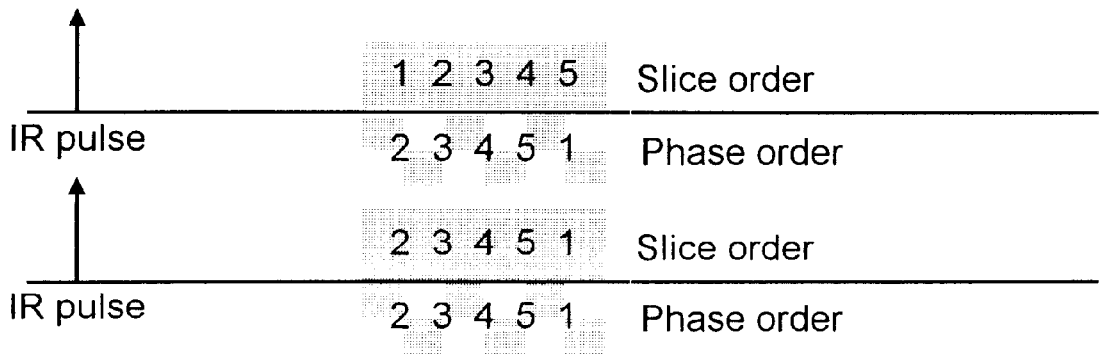
Continue looping...
FIG. 2  Pulse sequence details

MAGNETIC RESONANCE IMAGING APPARATUS

BACKGROUND

This invention relates to magnetic resonance imaging apparatus.

The invention especially relates to apparatus for producing images which suppress fluid, particularly apparatus using inversion recovery sequences.

One such sequence is Fluid-Attenuated Inversion Recovery (FLAIR).

FLAIR provides a highly sensitive means of detecting lesions of the brain, particularly in the periventicular region. However CSF flow can lead to poor CSF suppression, particularly in the brain stem, the foremana of Munroe and around the spinal cord. This problem can be avoided by the use of a non-selective inversion pulse, which inverts all the CSF, so that flow ceases to make any difference. A disadvantage in implementing this concept is that, the sequential excitation of the subsequent slices results in an inversion time that varies from slice to slice. This leads to variable contrast from one slice to the next with incomplete suppression of CSF in many slices.

Recently a method has been presented (Norris, D. G., ESMRMB Proc. 264, 1999) of reducing RF dose for MDEFT imaging at high field by using a single non-selective inversion pulse followed by a rapid stream of field echo slice excitations per TR. This method was subject to variable contrast due to the variable TI per slice, and this was dealt with by cycling the slice excitation order and associating each TI with a region of K-space rather than a particular slice.

SUMMARY

In accordance with the present invention, slice order cycling is applied to the FLAIR sequence.

This allows uniform contrast to be attained combined the desirable flow insensitive properties of non-selective inversion pulse. The cycling provides a mechanism which can ensure that data for vhich CSF is at its null point is placed at the centre of k-space in each slice. The sequence has interesting properties because of the very different state of magnetisation recovery of brain/cord and CSF.

DRAWINGS

Ways of carrying out the invention will now be described in greater detail, by way of example, with reference to the accompanying drawings, in which:

FIG. 2 shows pulse sequence details.

DESCRIPTION

Figure 1:
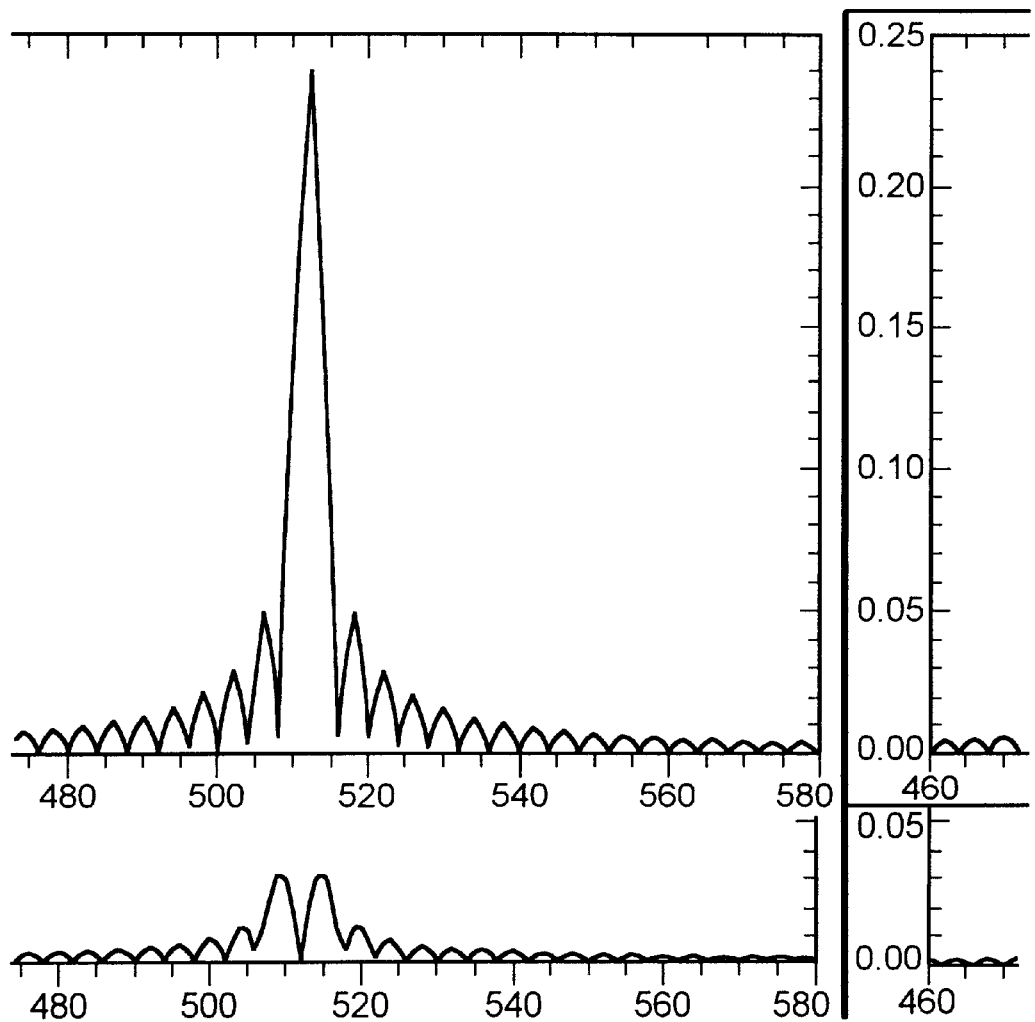
FIG. 1 shows two spread functions.

The basic sequence consists of a multi-slice spin echo acquisition with a non-selective IR pulse at the start of each TR. Within each TR each slice was excited once. At the next TR the slice firing order was incremented to that what was previously the last slice was excited first followed by the rest of the slices in the previous order. The phase encoding structure was similar in concept to Fast Spin Echo. Each phase encode is associated with a slice firing time, such that the lowest strip of k-space comes from the first excitation, the next part from the second and so on. The number of lines in each strip is the total number of phase lines divided by the number of slice. This results in a smooth continuous T1 filter across K-space with the centre of k-space collected at time TI for each slice.

Use of spin echoes fired in rapid succession with different phase encoding presents similar potential problems with stimulated echoes as are encountered with Fast Spin Echoes. In this case rather than using re-winders, the sequence structure requires the phase encode gradient to come after the refocusing pulse. Placement of the phase gradient prior to the refocusing pulse produces a stimulated echo offset from the centre of K-space by one phase encode group.

In one example, the sequence was implemented on a 1.0T Picker (Highland Heights, Cleveland, Ohio) HPQ Plus scanner. Its properties were tested using phantoms and on normal volunteers, who gave informed consent. Brain images were obtained with a bird cage coil and C-spine images were collected using a quadrature C-spine coil. Raw data was taken off line for reordering and reconstruction. The following parameters were used with the test sequence and a conventional FLAIR with non-selective inversion and a conventional fully interleaved FLAIR sequence: TE 30 msec, TR 6000 msec, FOV 35 cm, slice thickness 4 mm, 1 signal average, 128×256 resolution, TI 2100 msec, 9 slices.

The point spread functions (PSFs) for brain tissue ($T1 \approx 400$ msec) and CSF ($T1 \approx 4500$ msec) were simulated using IDL.

The new sequence produced CSF nulled images though out the brain and in the spinal canal. It was clearly superior to the fully interleaved IR variant in regions where CSF flow is significant, such as in the C-spine. The SNR of the test sequence was inferior than the conventional non-selective variant of FLAIR for the optimal slice, but compensated for this by producing uniform contrast in all slices.

The PSFs for tissue and CSF are shown in FIG. 1. The Tissue PSF is very similar to that for a standard conventional spin echo, whereas the PSF for CSF is suppressed by a factor of 8 and lacks a central high signal peak.

The variant of FLAIR test here provides appears to provide a practical solution to the problem examinations where CSF flow adversely affect the performance of conventional FLAIR sequences. A disadvantage of the current approach is that it is relatively slow, since no use has been mad of Fast Spin Echo methods. Combination of both multiple TIs and Tes in the same data set presents a challenge similar to the problems encountered with GRASE, where T2 and T2* are mixed.

The invention has been described with reference to the preferred embodiment. Obviously, modifications and alterations will occur to others upon reading and understanding the preceding description. It is intended that the invention be construed as including all such modifications and alterations insofar as they come within the scope of the appended claims or the equivalents thereof.

What is claimed is:

1. An apparatus for magnetic resonance imaging, comprising:

means for generating a main magnetic field in an examination region;

means for generating slice, phase-encode, and read magnetic field gradients for spatially encoding MR active nuclei in a region of interest of a patient in the examination region;

means for applying a non-selective inversion pulse to a plurality of slices;

means for exciting the spatially encoded MR active nuclei;

means for exciting r.f. resonance in MR active nuclei in the plurality of slices in an excitation order, wherein the excitation order is cycled such that the time from the non-selective inversion pulse to any particular phase-encode gradient of all the slices is the same; and means for receiving r.f. signals from the excited MR active nuclei.

2. An apparatus according to claim 1 wherein the time at which the phase-encode gradient is zero corresponds to a time for which the r.f. signal received from a material in the region of interest is approximately zero.

3. An apparatus according to claim 2 wherein the material is a fluid.

4. An apparatus according to claim 3 wherein the fluid is moving.

5. An apparatus according to claim 4 wherein the fluid is cerebro-spinal fluid.

* * * * *